(12) United States Patent
Bae et al.

(10) Patent No.: US 11,193,985 B2
(45) Date of Patent: Dec. 7, 2021

(54) APPARATUS AND METHOD FOR DIAGNOSING BATTERY

(71) Applicant: LG Chem, Ltd., Seoul (KR)

(72) Inventors: Yoon-Jung Bae, Daejeon (KR); Dae-Soo Kim, Daejeon (KR); Ji-Yeon Kim, Daejeon (KR); Dong-Kyu Kim, Daejeon (KR); Jae-Hyun Lee, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/650,180

(22) PCT Filed: Apr. 10, 2019

(86) PCT No.: PCT/KR2019/004297
§ 371 (c)(1),
(2) Date: Mar. 24, 2020

(87) PCT Pub. No.: WO2019/199064
PCT Pub. Date: Oct. 17, 2019

(65) Prior Publication Data
US 2021/0041506 A1   Feb. 11, 2021

(30) Foreign Application Priority Data
Apr. 10, 2018   (KR) .................. 10-2018-0041693

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/382* (2019.01); *G01R 31/396* (2019.01); *G01R 31/3648* (2013.01)

(58) Field of Classification Search
None
See application file for complete search history.

(56) References Cited

U.S. PATENT DOCUMENTS 9,461,490 B2   10/2016   Ying
2011/0012604 A1*   1/2011   Tsujiko ................. H01M 4/587
324/427
(Continued)

FOREIGN PATENT DOCUMENTS

CN   102590754 A   7/2012
CN   103457003 A   12/2013
(Continued)

OTHER PUBLICATIONS

International Search Report for Application No. PCT/KR2019/004297 dated Jul. 25, 2019, 2 pages.
(Continued)

*Primary Examiner* — John C Kuan
(74) *Attorney, Agent, or Firm* — Lerner, David, Littenberg, Krumholz & Mentlik, LLP

(57) ABSTRACT

An apparatus for diagnosing a battery includes a sensing unit configured to measure a potential and a current of a battery, and a processor configured to estimate a capacity of the battery based on the current measured by the sensing unit, detect inflection points in potential-capacity data in which the potential and the estimated capacity are mapped with each other, estimate an electrode potential of each inflection point, calculate a potential difference between each estimated electrode potential and a reference electrode potential, diagnose a change of at least one of an active material area, a depth of charge and a depth of discharge of an electrode of the battery based on an increase or decrease pattern of the plurality of calculated potential differences, (Continued)

and determine a mode of the battery as a normal mode or a failure mode based on the diagnosis result.

15 Claims, 6 Drawing Sheets

(51) Int. Cl.
 *G01R 31/396* (2019.01)
 *G01R 31/382* (2019.01)
 *G01R 31/36* (2020.01)

(56) References Cited

U.S. PATENT DOCUMENTS

| | | | |
|---|---|---|---|
| 2012/0176092 | A1 | 7/2012 | Fujii et al. |
| 2013/0119940 | A1 | 5/2013 | Iriyama et al. |
| 2013/0314050 | A1 | 11/2013 | Matsubara et al. |
| 2014/0125345 | A1 | 5/2014 | Sejima et al. |
| 2015/0051855 | A1 | 2/2015 | Joe et al. |
| 2015/0066407 | A1 | 3/2015 | Joe et al. |
| 2015/0084639 | A1 | 3/2015 | Joe |
| 2015/0100260 | A1 | 4/2015 | Joe et al. |
| 2015/0226809 | A1 | 8/2015 | Joe et al. |
| 2015/0357852 | A1 | 12/2015 | Nakao et al. |
| 2016/0061908 | A1 | 3/2016 | Torai et al. |
| 2016/0181833 | A1 | 6/2016 | Araki et al. |
| 2017/0146609 | A1 | 5/2017 | Uchino et al. |
| 2017/0234930 | A1 | 8/2017 | Lee et al. |
| 2018/0090754 | A1* | 3/2018 | Muraki ............... H01M 10/345 |
| 2020/0271727 | A1 | 8/2020 | Bae et al. |

FOREIGN PATENT DOCUMENTS

| | | |
|---|---|---|
| CN | 104364669 A | 2/2015 |
| CN | 104395771 A | 3/2015 |
| CN | 104541175 A | 4/2015 |
| CN | 104685367 A | 6/2015 |
| CN | 104871021 A | 8/2015 |
| CN | 105388422 A | 3/2016 |
| EP | 3015876 A1 | 5/2016 |
| JP | 2012054220 A | 3/2012 |
| JP | 2013247003 A | 12/2013 |
| JP | 2014007025 A | 1/2014 |
| JP | 2014092471 A | 5/2014 |
| JP | 2014139897 A | 7/2014 |
| JP | 2014167457 A | 9/2014 |
| JP | 2015025402 A | 2/2015 |
| JP | 2016009659 A | 1/2016 |
| JP | 2016014588 A | 1/2016 |
| JP | 2016145795 A | 8/2016 |
| JP | 6038275 B2 | 12/2016 |
| JP | 2017059386 A | 3/2017 |
| KR | 20090020288 A | 2/2009 |
| KR | 20170023583 A | 3/2017 |
| KR | 20170073314 A | 6/2017 |
| WO | 2014128902 A1 | 8/2014 |
| WO | 20 19199058 A1 | 10/2019 |

OTHER PUBLICATIONS

Wang L, Pan C, Liu L, Cheng Y, Zhao X. On-board state of health estimation of LiFePO4 battery pack through differential voltage analysis. Applied energy. Feb. 12, 2016;168:465-72.
Extended European Search Report including Written Opinion for EP19785914.3 dated Feb. 9, 2021; 14 pages.
Chinese Search Report for Application No. 201980004947.0 dated Oct. 20, 2021, 3 Pages.

* cited by examiner

APPARATUS AND METHOD FOR DIAGNOSING BATTERY

CROSS-REFERENCE TO RELATED APPLICATIONS

The present application is a national phase entry under 35 U.S.C. § 371 of International Application No. PCT/KR2019/004297 filed Apr. 10, 2019, published in Korean, which claims priority from Korean Patent Application 10-2018-0041693 filed Apr. 10, 2018, all of which are incorporated herein by reference.

TECHNICAL FIELD

The present application claims priority to Korean Patent Application No. 10-2018-0041693 filed on Apr. 10, 2018 in the Republic of Korea, the disclosures of which are incorporated herein by reference.

The present disclosure relates to an apparatus and method for diagnosing a battery, and more particularly, to an apparatus and method for diagnosing a battery for diagnosing changes of an active material area, a depth of charge and a depth of discharge of an electrode of a battery.

BACKGROUND ART

A secondary battery generates electric energy through electrochemical oxidation and reduction reactions and is used in a wide variety of applications. For example, the use area of the secondary battery is gradually expanding to portable devices capable of being carried in a human hand, such as a cellular phone, a laptop computer, a digital camera, a video camera, a tablet computer, or a power tool; various electricity-driven devices such as an electric bicycle, an electric motorcycle, an electric vehicle, a hybrid electric vehicle, an electric boat, or an electric plane; power storage devices used for storing power generated by renewable energy or surplus generated power; power supply devices for stably supplying power to various information communication devices including a server computer and a base station for communication; and the like.

The secondary battery includes three basic components, namely a negative electrode (anode) containing a substance that is oxidized while discharging electrons during discharge, a positive electrode (cathode) containing a substance that is reduced while accepting electrons during discharge, and an electrolyte that allows ion transfer between the negative electrode and the positive electrode. The battery may be classified as a primary battery that is not reusable after being discharged and a secondary battery that allows repeated charging and discharging since the electrochemical reaction is at least partly reversible.

Examples of secondary batteries known in the art include lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries, and the like. Among them, the lithium secondary batteries have attracted the greatest commercial interest due to their high energy density, high battery voltage and long life, compared to other secondary batteries.

Meanwhile, an electrode potential of the secondary battery is measured to check the performance of the secondary battery.

In order to measure the electrode potential, a three-electrode-system electrode potential measuring method using a reference electrode, a working electrode and a potential electrode is mainly used.

The reference electrode is an electrode that is used to make a battery circuit for measuring an electrode potential by combining with an electrode of a battery or an electrode where electrolysis is taking place in order to measure the potential of the electrode. The reference electrode serves as a reference of potential when a relative value of the electrode potential is measured.

The reference electrode is a reversible electrode potential and should follow the Nernst equilibrium theorem. Also, the reference electrode should satisfy the requirements such as a non-polarizing property of always maintaining a constant potential value, as small liquid potential difference as possible, a small potential change in spite of the change of temperature, and a constant potential value at a constant temperature.

One reference electrode is combined per battery cell in order to measure the electrode potential. To enhance the reliability of the reference electrode, the reference electrode is activated into a flat potential with no potential change due to charge or discharge.

The electrode potential measured through the above process is not only dependent on the type and capacity of the applied secondary battery but also dependent on the degradation due to use even when the type or capacity of the secondary battery is specified. Thus, there is a need for a technique to diagnose the performance and degeneration of a secondary battery by using an electrode potential.

SUMMARY

Technical Problem

The present disclosure is directed to diagnosing the increase or decrease of an active material area of an electrode of a battery in response to whether a potential difference between an electrode potential of the battery and a reference electrode potential increases or decreases according to the capacity corresponding to the electrode potential of the battery.

In addition, the present disclosure is directed to diagnosing changes of a depth of charge and a depth of discharge of the electrode of the battery in response to whether the electrode potential of the battery is included in a reference potential range.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a battery, comprising: one or more sensors configured to measure a potential and a current of a battery; and a processor configured to estimate a capacity of the battery based on the current measured by the one or more sensors, generate potential-capacity data indicating a mapping of the potential measured by the one or more sensors and the estimated capacity with each other, detect a plurality of inflection points included in the potential-capacity points, for each detected inflection point, estimate each of an electrode potential at the detected inflection point, for each estimated electrode potential, calculate a potential difference between the plurality of estimated electrode potential and a reference electrode potential, determine whether at least one of an active material area, a depth of charge or a depth of discharge of an electrode of the battery is changed based on an increase or decrease pattern of the plurality of calculated potential differences, and determine a mode of the battery based on whether at least one of the active material area, the depth of charge or the depth of discharge is changed, wherein the mode of the battery is one of a normal mode or a failure mode.

The processor may be configured to determine a total number of inflection points included in the potential-capacity data, and determine a negative electrode active material type and a positive electrode active material type of the battery based on the total number of inflection points included in the potential-capacity data, and further based on previously stored active material type data in which the total number of inflection points, the negative electrode active material type and the positive electrode active material type are mapped with one another.

The processor may be configured to determine that the mode of the battery is the failure mode when it is determined that at least one of the active material area, the depth of charge or the depth of discharge is changed.

The processor may be configured to classify the plurality of inflection points into a first group and a second group according to a respective magnitude of potential for each of the inflection points.

The processor may be configured to, for each inflection point included in the first group, extract a reference positive electrode potential matched with a reference capacity corresponding to the capacity of the inflection point from stored first electrode-capacity data, and estimate the extracted reference positive electrode potential as a positive electrode potential at the capacity of the inflection point.

The processor may be configured to, for each inflection point included in the second group, extract a reference negative electrode potential matched with a reference capacity corresponding to the capacity of the inflection point from stored second electrode-capacity data, and estimate a positive electrode potential at the capacity of the inflection point based on the extracted reference negative electrode potential and the potential of the inflection point.

The stored first electrode-capacity data may be previously stored data in which the reference positive electrode potential and the reference capacity are matched according to a positive electrode active material type.

The stored second electrode-capacity data may be previously stored data in which the reference negative electrode potential and the reference capacity are matched according to a negative electrode active material type.

Each estimated electrode potentials may correspond to a different reference electrode potential.

The processor may be configured to, for each estimated electrode potential, calculate a potential difference between the corresponding reference electrode potential and the estimated electrode potential.

When all of the potential differences calculated for all of the plurality of estimated electrode potentials are 0V, the processor may be configured to determine that none of the active material area, the depth of discharge or the depth of charge are changed, and determine the mode of the battery is the normal mode.

When the potential difference calculated for an electrode potential corresponding to a smallest capacity among the plurality of estimated electrode potentials is 0V, the processor may be configured to determine that the depth of discharge is not changed.

When the potential difference calculated for the electrode potential corresponding to the smallest capacity is greater than 0V, the processor may be configured to determine that the depth of discharge is decreased.

When the potential difference calculated for the electrode potential corresponding to the smallest capacity is smaller than 0V, the processor may be configured to determine that the depth of discharge is increased.

When the potential differences calculated for the plurality of estimated electrode potentials are identical, the processor may be configured to determine that the active material area is not changed.

When the potential differences calculated for the plurality of estimated electrode potentials increase as a corresponding capacity increases, the processor may be configured to determine that the active material area is decreased.

When the potential differences calculated for the plurality of estimated electrode potentials decrease as a corresponding capacity increases, the processor may be configured to determine that the active material area is increased.

When the potential difference calculated for an electrode potential corresponding to a greatest capacity among the plurality of estimated electrode potentials is 0V, the processor may be configured to determine that the depth of charge is not changed.

When the potential difference calculated for the electrode potential corresponding to the greatest capacity is greater than 0V, the processor may be configured to determine that the depth of charge is increased.

When the potential difference calculated for the electrode potential corresponding to the greatest capacity is smaller than 0V, the processor may be configured to determine that the depth of charge is decreased.

The processor may be configured to calculate a rate of change between the reference electrode potentials, adjust a size of a preset reference capacity region based on the calculated change rate, and calculate the potential difference by selecting only an electrode potential belonging to the size-adjusted reference capacity region among the estimated electrode potentials.

The processor may be configured to select at least one diagnosis target electrode among positive electrodes or negative electrodes included in the battery, and determine whether at least one of the active material area, the depth of charge or the depth of discharge of the selected diagnosis target electrode is changed, and determine the mode of the battery based on whether at least one of the active material area, the depth of charge or the depth of discharge of the selected diagnosis target electrode is changed.

A battery management system according to another embodiment of the present disclosure may comprise the apparatus for diagnosing a battery according to any of the embodiments of the present disclosure.

A vehicle according to another embodiment of the present disclosure may comprise the apparatus for diagnosing a battery according to any of the embodiments of the present disclosure.

In another aspect of the present disclosure, there is also provided a method for diagnosing a battery, comprising: measuring a potential and a current of a battery; estimating a capacity of the battery based on the measured current; generating potential-capacity data indicating a mapping of the measured potential and the estimated capacity with each other; detecting a plurality of inflection points included in potential-capacity data; for each detected inflection point, estimating an electrode potential at the detected inflection point; for each estimated electrode potential, calculating a potential difference between the estimated electrode potential and a reference electrode potential; determine whether at least one of an active material area, a depth of charge or a depth of discharge of an electrode of the battery is changed based on an increase or decrease pattern of the plurality of calculated potential differences; and determining a mode of the battery based on whether at least one of the active material area, the depth of charge or the depth of discharge is changed, wherein the mode of the battery is one of a normal mode or a failure mode.

Advantageous Effects

According to the present disclosure, in estimating an electrode potential of a battery, it is possible to estimate a positive electrode potential and a negative electrode potential of the battery by measuring only the potential of the battery without using a reference electrode.

Also, according to the present disclosure, it is possible to extract inflection data from potential-capacity data of the battery and determine the type of a positive electrode active material and a negative electrode active material of the battery based on the number of extracted inflection data.

Also, according to the present disclosure, since the increase and decrease of the active material area of the battery is diagnosed in response to whether the potential difference between the electrode potential of the battery and the reference electrode potential increases or decreases according to the capacity corresponding to the electrode potential of the battery, it is possible to rapidly and accurately figure out the change of the active material area of each electrode of the battery.

Also, according to the present disclosure, since the changes of a depth of charge and a depth of discharge of the battery are diagnosed in response to whether the electrode potential of the battery is included in the reference potential range, it is possible to rapidly and accurately figure out the changes of the depth of charge and the depth of discharge of each electrode of the battery.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term <processor> described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
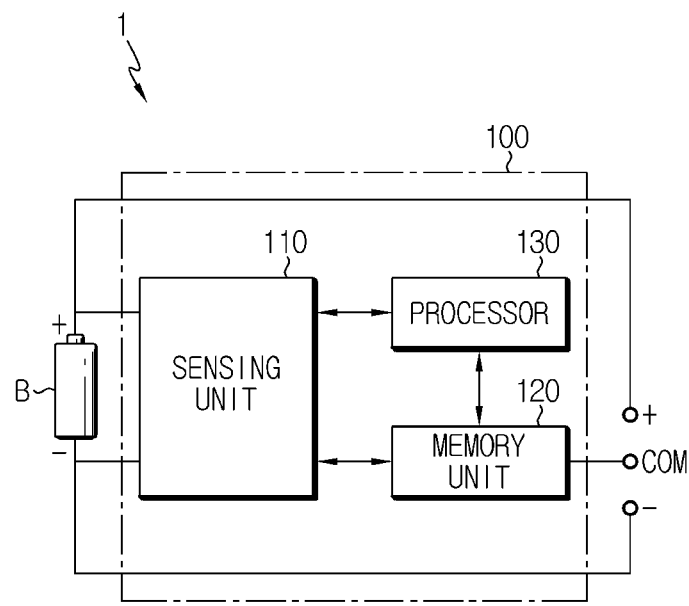
FIG. 1 is a diagram showing an apparatus for diagnosing a battery according to an embodiment of the present disclosure.

FIG. 1 is a diagram showing an apparatus for diagnosing a battery according to an embodiment of the present disclosure.

Referring to FIG. 1, an apparatus 100 for diagnosing a battery according to an embodiment of the present disclosure may be included in a battery pack 1 that has a battery B and may be connected to the battery B to diagnose changes of an active material area, a depth of charge and a depth of discharge of an electrode of the battery B. Here, the battery B may include a positive electrode and a negative electrode. Also, the battery B may mean a battery of which the active material area, the depth of charge and the depth of discharge are diagnosed. In addition, the apparatus 100 for diagnosing a battery according to an embodiment of the present disclosure may be included in a battery management system (BMS) provided in a battery pack 1.

The battery B may include a plurality of unit cells electrically connected in series and/or in parallel. Of course, the case where the battery pack B includes only one unit cell also falls into the scope of the present disclosure. Here, the unit cell is not limited to a particular type and includes any cell type that can be recharged repeatedly. For example, the unit cell may be a pouch-type lithium polymer battery.

The battery B may be electrically coupled to various types of external devices through an external terminal. For example, the external device may be an electric vehicle, a hybrid electric vehicle, a flying object such as a drone, a large-capacity energy storage system (ESS) included in an electrical grid, or a mobile device. In this case, the battery B may include some or all unit cells included in a modularized battery pack mounted in the external device.

The external terminal of the battery B may be selectively coupled to a charging device. The charging device may be selectively coupled to the battery B by the control of the external device to which the battery pack B is mounted.

Hereinafter, the functional configuration of the apparatus for diagnosing a battery according to an embodiment of the present disclosure is described in detail with reference to FIG. 1.

Referring to FIG. 1, the apparatus 100 for diagnosing a battery may include a sensing unit 110, a memory unit 120 and a processor 130.

The sensing unit 110 is operably coupled to the processor 130. That is, the sensing unit 110 may be connected to the processor 130 to transmit an electrical signal to the processor 130 or receive an electrical signal from the processor 130.

The sensing unit 110 may repeatedly measure a potential applied between a positive electrode and a negative electrode of the battery B and a current flowing into or out of the battery B at predetermined intervals, and provide a measurement signal indicating the measured potential and current to the processor 130.

The sensing unit 110 includes a current sensor configured to measure the current of the battery B. Also, the sensing unit 110 may further include a voltage sensor configured to measure the potential of the battery B. Though not shown in FIG. 1, the current sensor may be connected to both ends of a sense resistor connected to the battery B through a circuit. That is, the current sensor may measure a potential difference between both ends of the sense resistor and measure the current of the battery B based on the measured potential difference and the resistance value of the sense resistor.

When the processor 130 receives the measurement signal from the sensing unit 110, the processor 130 may determine a digital value of each of potential and current of the battery through signal processing, and store the digital value in the memory unit 120.

The memory unit 120 is a semiconductor memory device that records, erases and updates data generated by the processor 130, and stores a plurality of program codes prepared for estimating an electrode potential of the battery B. In addition, the memory unit 120 may store preset values of various predetermined parameters used in implementing the present disclosure.

The memory unit 120 may is not particularly limited as long as it is a semiconductor memory element known in the art as being capable of recording, erasing and updating data. For example, the memory unit 120 may be dynamic random-access memory (DRAM), synchronous dynamic-random access memory (SDRAM), a flash memory, read-only memory (ROM), electrically erasable programmable read-only memory (EEPROM), a register, and the like. In addition, the memory unit 120 may further include a storage medium that stores program codes defining the control logics of the processor 130. The storage medium includes a non-volatile storage element such as a flash memory or a hard disk. The memory unit 120 may be physically separate from the processor 130 or may be integrated with the processor 130.

The processor 130 may control the current of the battery B so that the current of a preset charging current value is inputted to the battery B to charge the battery B, and estimate a capacity of the battery B based on the current input to the battery B. Here, the capacity of the battery B is identical to a State of Charge (SOC) of the battery B.

At this time, the preset charging current value may be calculated using Equation 1 below.

$$I_C = a \times C_n \qquad \text{[Equation 1]}$$

Here, Ic may be a preset charging current value, α may be a constant of 1 or less, and Cn may be a rated current of the battery.

Accordingly, the processor 130 may estimate the capacity of the battery B which is charged by receiving the current having a charging current value equal to or less than the rated current.

In addition, the processor 130 may estimate the capacity of the battery B by using a current integration method that integrates current values of the current input to the battery B. Here, even though it has been described that the processor 130 estimates the capacity of the battery B by using the current integration method, the estimation method is not limited thereto as long as the capacity of the battery B to which the current of a preset charging current value is input can be estimated.

Meanwhile, the processor 130 may generate potential-capacity data of the battery B by mapping the potential measured by the sensing unit 110 with the estimated capacity of the battery B.

Here, the potential of the battery B may be an open circuit voltage of the battery B.

Figure 2:
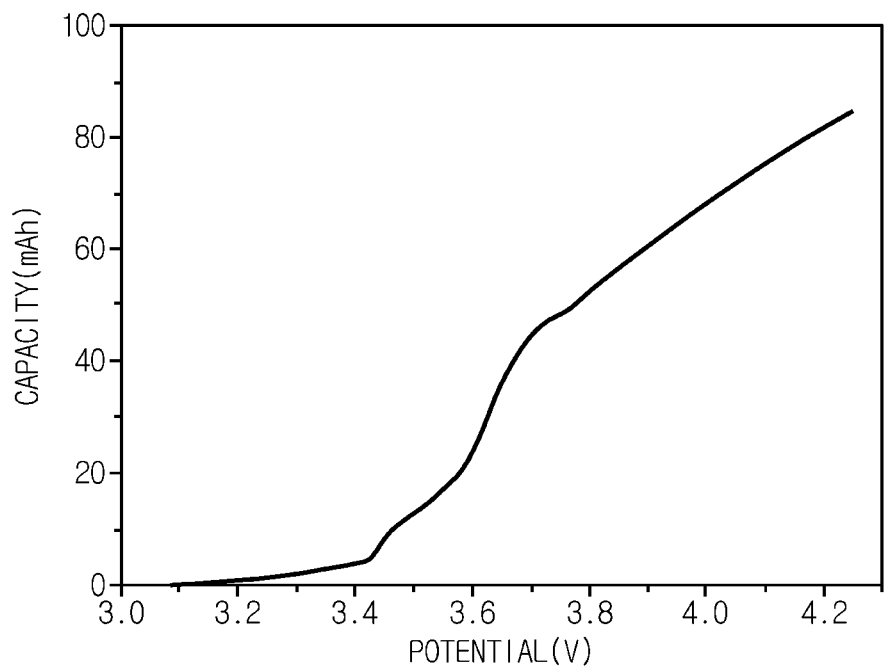
FIG. 2 is a capacity graph of a battery according to a potential of the battery.

FIG. 2 is a capacity graph of a battery according to a potential of the battery. As shown in FIG. 2, the potential-capacity data of the battery B may be expressed as a potential curve of the battery B according to the capacity of the battery B. Namely, the processor 130 may express the generated potential-capacity data in a two-dimensional graph where the X axis is a potential (V) and the Y axis is a capacity (mAh).

At this time, the memory unit 120 may store the potential-capacity data of the battery B in at least one form of an approximation function that approximates the potential-capacity data of the battery B to the potential curve of the battery B according to the capacity of the battery B and a lookup table where the potential of the battery B is mapped with each capacity of the battery B.

The processor 130 may detect inflection data of potential-capacity data based on the potential-capacity data of the battery B. Here, the inflection data may be data that includes a potential and a capacity at an inflection point located on the curve shown in FIG. 2.

More specifically, the processor 130 may detect the potential and the capacity of the battery B at a point where the change of the capacity of the battery B increases and then decreases according to a minute change of the potential based on the potential-capacity data as the inflection point.

Also, the processor 130 may detect the potential and the capacity of the battery B at a point where the change of the capacity of the battery B decreases and then increases according to the minute change of the potential based on the potential-capacity data as the inflection point.

That is, the processor 130 may detect the potential where a second-order derivative coefficient of an approximation function corresponding to the potential-capacity data of the battery B is "0" and the capacity of the battery B corresponding to the potential as the inflection point.

Figure 3:
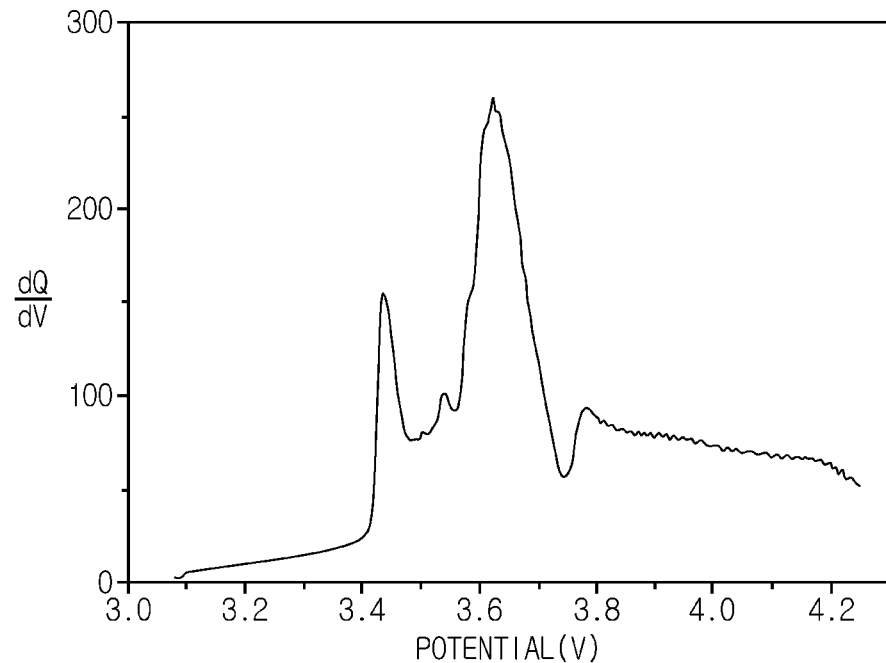
FIGS. 3 and 4 are capacity differential graphs of the battery according to the potential of the battery before and after smoothing.
Figure 4:
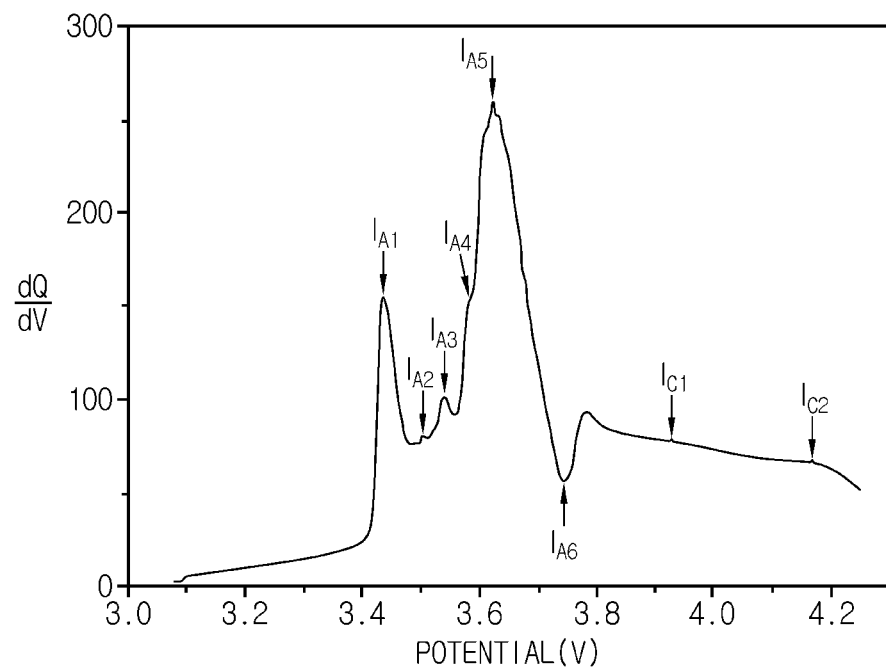

An example of a first-order derivative of the potential-capacity data will be described with reference to FIGS. 3 and 4. FIGS. 3 and 4 are capacity differential graphs of the battery according to the potential of the battery before and after smoothing.

The processor 130 may calculate a first-order derivative by differentiating the approximation function corresponding to the potential-capacity data of the battery B, as shown in FIG. 3.

After that, the processor 130 may remove noise components by smoothing the first-order derivative of the approximation function corresponding to the potential-capacity data of the battery B, as shown in FIG. 4.

At this time, the processor 130 may smooth the first-order derivative of the approximation function corresponding to the potential-capacity data of the battery B by using a noise filter.

In this way, the processor 130 may prevent false detection of the inflection data caused by noise components, thereby improving the accuracy of inflection data detection.

Subsequently, the processor 130 may calculate a second-order derivative by differentiating the first-order derivative of the smoothed approximation function, and detect the potential where a function value of the calculated second-order derivative is "0" and the capacity of the battery B corresponding to the potential as the inflection data.

That is, as shown in FIG. 4, the processor 130 may detect eight inflection data IA1 to IA6, IC1, IC2 of the battery B.

The processor 130 may classify the plurality of detected inflection data into a first group and a second group according to the magnitude of potential. For example, the processor 130 may compare a potential corresponding to the detected inflection data with a preset reference potential, and classify the inflection data into the first group or the second group according to the comparison result.

More specifically, the processor 130 may classify the inflection data into the first group if the potential of the inflection data is equal to or greater than the preset reference potential. Conversely, the processor 130 may classify the inflection data into the second group if the potential corresponding to the inflection data is smaller than the preset reference potential.

Here, the inflection data belonging to the first group may be inflection data detected by the electrical characteristic of an active material type of the positive electrode, among the positive electrode and the negative electrode of the battery B, and the inflection data belonging to the second group may be inflection data detected by the electrical characteristic of an active material type of the negative electrode, among the positive electrode and the negative electrode of the battery B.

For example, if the preset reference potential is "3.8V", the processor 130 may classify the inflection data IC1, IC2, of which the corresponding potential is equal to or greater than the preset reference potential "3.8V", into the first group among the detected inflection data IA1 to IA5, IC1, IC2.

On the contrary, the processor 130 may classify the inflection data IA1 to IA6, of which the corresponding potential is smaller than the preset reference potential "3.8V", into the second group among the detected inflection data IA1 to IA6, IC1, IC2.

The processor 130 may identify the active material type of the electrode of the battery B based on the detected inflation data IA1 to IA6, IC1, IC2. More specifically, processor 130 may identify the positive electrode active material type and the negative electrode active material type of the battery B based on the number of inflection data IC1, IC2 belonging to the first group and the number of inflection data IA1 to IA6 belonging to the second group.

For this purpose, the memory unit 120 may store active material type data in which the active material type of the electrode is mapped with respect to the number of inflection data belonging to the first group and the number of inflection data in the second group in advance.

For example, as in the embodiment of FIG. 4, it is assumed that the number of the inflection data IC1, IC2 belonging to the first group is 2 and the number of the inflection data IA1 to IA6 belonging to the second group is 6. In this case, the active material type data may be stored in the memory unit 120 as a positive electrode active material "$LiMO_2$" and a negative electrode active material "$SiO_2$".

The processor 130 may identify the positive electrode active material type and the negative electrode active material type of the battery B based on the number of inflection data belonging to the first group and the number of inflection data belonging to the second group by using the active material type data stored in the memory unit 120.

The processor 130 may be configured to estimate the electrode potential of the plurality of inflection data based on the potential, capacity and number of the plurality of detected inflection data, after identifying the positive electrode active material type and the negative electrode active material type.

Figure 5:
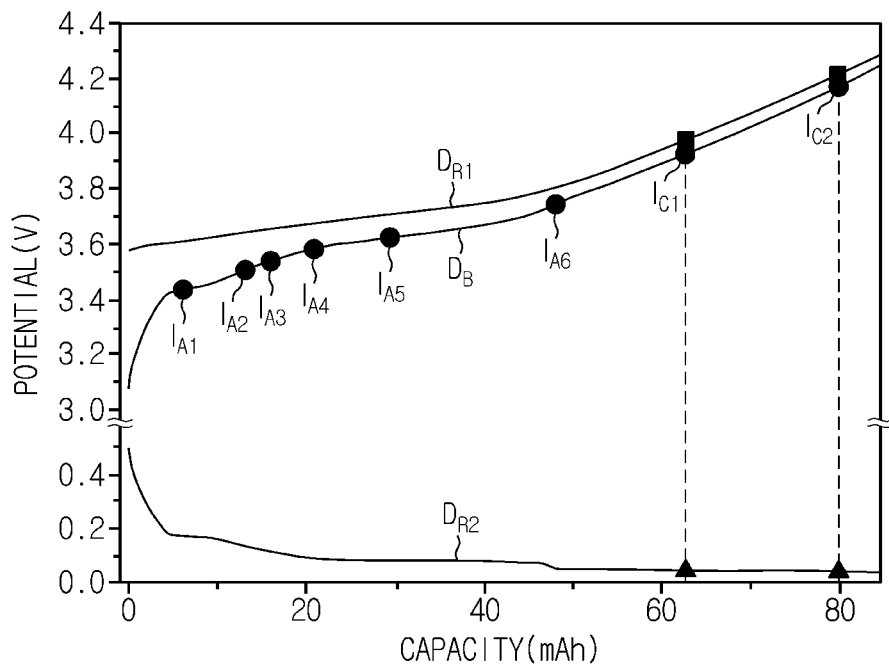
FIGS. 5 and 6 are graphs showing a potential of a battery according to a capacity of the battery and a first electrode potential and a second electrode potential of a reference battery according to a capacity of the reference battery.
Figure 6:
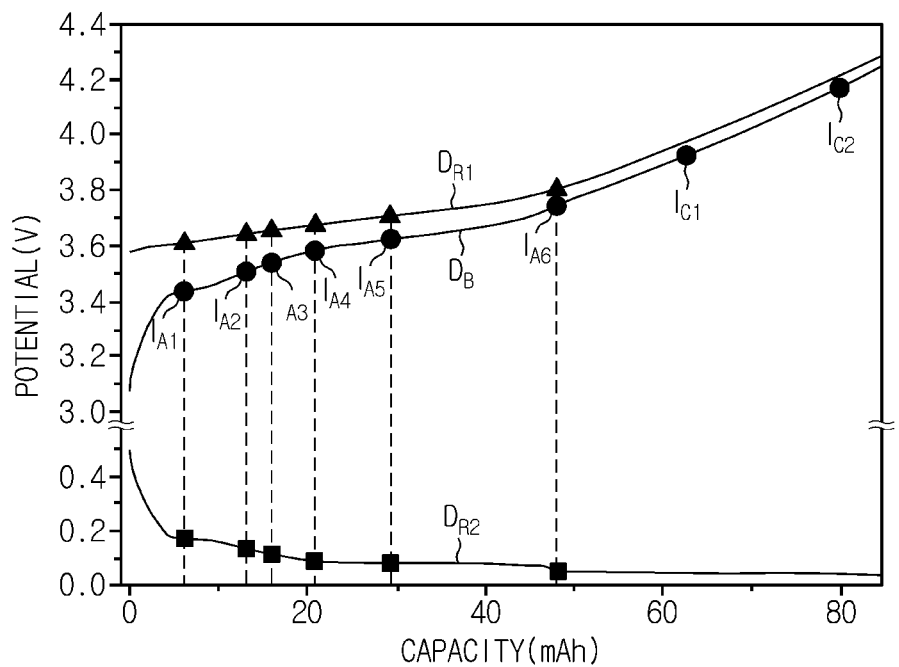

Estimation of the electrode potential of the plurality of inflection data will be described with reference to FIGS. 5 and 6. FIGS. 5 and 6 are graphs showing a potential of a battery according to a capacity of the battery and a first electrode potential and an electrode potential of a reference battery according to a capacity of the reference battery.

DR1 shown in FIGS. 5 and 6 is first electrode-capacity data stored in the memory unit 120 in advance, and DR2 is second electrode-capacity data stored in the memory unit 120 in advance. Here, the stored first electrode-capacity data is a previously stored data where a reference positive electrode potential and a reference capacity are matched according to the positive electrode active material type, and the stored second electrode-capacity data is a previously stored data where a reference negative electrode potential and the reference capacity are matched according to the negative electrode active material type. That is, the memory unit 120 may store the first potential-capacity data and the second potential-capacity data for each reference battery having various active material types in advance.

The processor 130 may extract the reference positive electrode potential matched with the reference capacity corresponding to the capacity of the inflection data belonging to the first group from the stored first electrode-capacity data, and estimate the extracted reference positive electrode potential as the positive electrode potential at each capacity of the inflection data belonging to the first group.

For example, in the embodiment of FIG. 5, the processor 130 may read the potential of the inflection data IC1, IC2 belonging to the first group from the potential-capacity data. After that, the processor 130 may extract the reference positive electrode potential of the reference battery matched with the reference capacity corresponding to the capacity of the inflection data IC1, IC2 belonging to the first group from the stored first potential-capacity data DR1. In addition, the processor 130 may estimate the negative electrode potential of the inflection data IC1, IC2 belonging to the first group by using the difference between the extracted reference positive electrode potential and the potential of the inflection data IC1, IC2 belonging to the first group. At this time, the processor 130 may calculate the difference between the reference positive electrode potential and the potential of the inflection data IC1, IC2 belonging to the first group by using Equation 2 below.

$$VBA = VRC - VB1 \quad \text{[Equation 2]}$$

Here, VBA is the first electrode potential, VRC is the reference positive electrode potential of the reference battery, and VB1 is the potential of the inflection data IC1, IC2 belonging to the first group.

In the embodiment of FIG. 5, the potential VB1 of the inflection data IC1, IC2 belonging to the first group is marked as "●", the reference positive electrode potential VRC of the reference battery is marked as "■", and the calculated first electrode potential VBA is marked as "▲".

After the first electrode potential VBA is calculated using Equation 2, the processor 130 may estimate the calculated first electrode potential VBA as the negative electrode potential of the battery B and estimate the reference positive electrode potential VRC as the positive electrode potential of the battery B.

Also, the processor 130 may extract the reference negative electrode potential matched with the reference capacity corresponding to the capacity of the inflection data belonging to the second group from the stored second electrode-capacity data, and estimate the extracted reference negative electrode potential as the negative electrode potential at each capacity of the inflection data belonging to the second group.

For example, in the embodiment of FIG. 6, the processor 130 may read the potential of the inflection data IA1 to IA6 belonging to the second group from the potential-capacity data. After that, the processor 130 may extract the reference negative electrode potential of the reference battery matched with the reference capacity corresponding to the capacity of the inflation data IA1 to IA6 belonging to the second group from the stored second potential-capacity data DR2. In addition, the processor 130 may estimate the positive electrode potential of the inflection data IA1 to IA6 belonging to the second group based on the difference between the extracted reference negative electrode potential and the potential of the inflection data IA1 to IA6 belonging to the second group. At this time, the processor 130 may calculate the difference between the reference negative electrode potential and the potential of the inflection data IA1 to IA6 belonging to the second group using Equation 3 below.

$$VBC = VRA + VB2 \quad \text{[Equation 3]}$$

Here, VBC is the second electrode potential, VRA is the reference negative electrode potential of the reference battery, and VB2 is the potential of the inflection data IA1 to IA6 belonging to the second group.

In the embodiment of FIG. 6, the potential VB2 of the inflection data IA1 to IA6 belonging to the second group is marked as "●", the reference negative electrode potential VRA of the reference battery is marked as "■", and the calculated second electrode potential VBC is marked as "▲".

After the second electrode potential VBC is calculated using Equation 3, the processor 130 may estimate the calculated second electrode potential VBC as the positive electrode potential of the battery B and calculate the reference negative electrode potential VRA as the negative electrode potential of the battery B.

Namely, in estimating the electrode potential of the battery B, the apparatus for diagnosing a battery according to an embodiment of the present disclosure may accurately estimate the positive electrode potential and the negative electrode potential of the battery B by measuring only the potential of the battery B without using the reference electrode.

After that, the processor 130 may calculate a potential difference between the estimated electrode potential of the battery B and the reference electrode potential. Specifically, the processor 130 may calculate the potential difference between the estimated electrode potential of the battery B and the reference electrode potential.

The calculation of the potential difference between the estimated positive electrode potential of the battery B and the reference electrode potential will be described in detail with reference to FIGS. 7 to 10.

Figure 7:
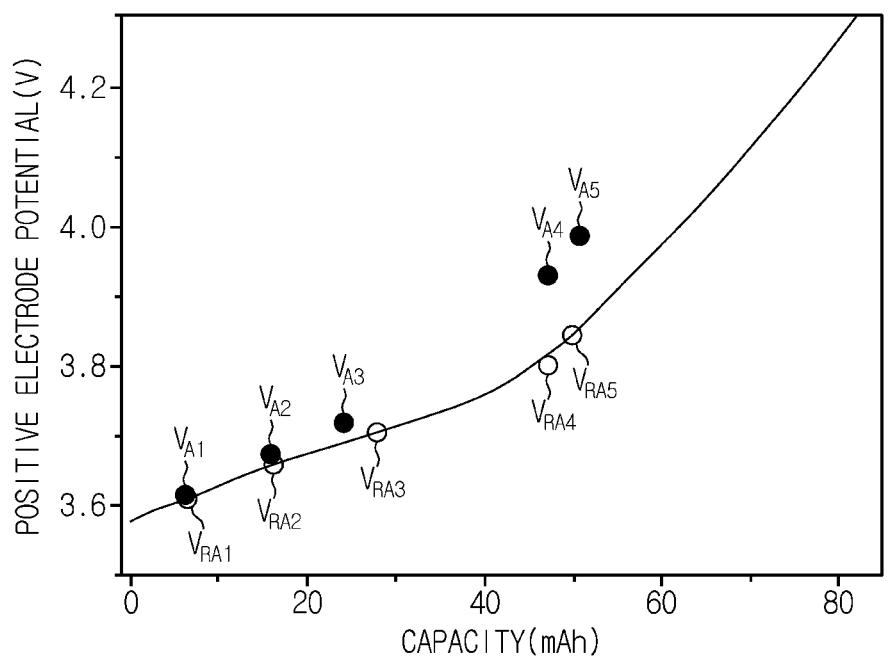
FIG. 7 is a diagram showing a first example of the positive electrode potential of the battery and the reference electrode potential.
Figure 8:
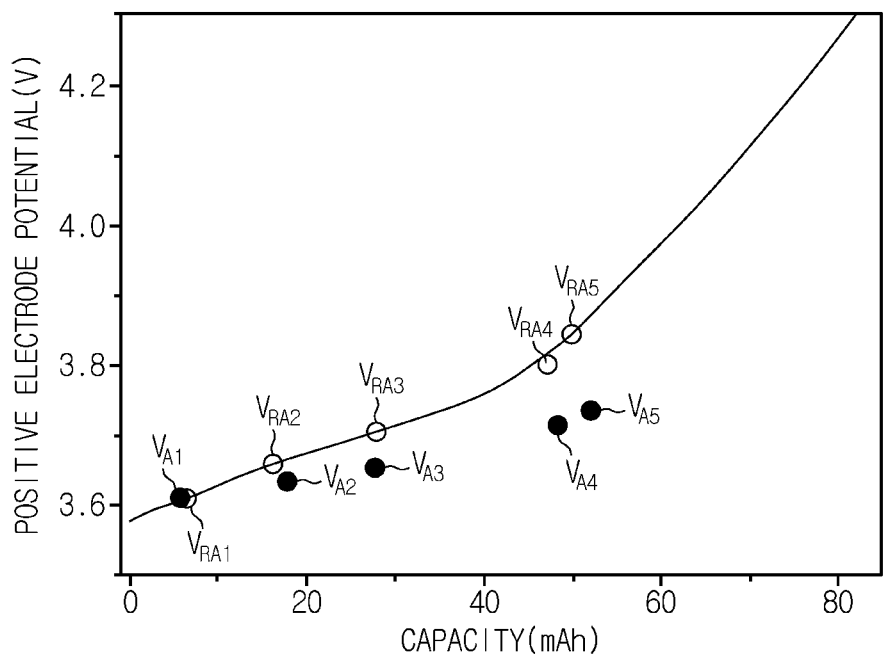
FIG. 8 is a diagram showing a second example of the positive electrode potential of the battery and the reference electrode potential.

FIG. 7 is a diagram showing a first example of the positive electrode potential of the battery and the reference electrode potential. FIG. 8 is a diagram showing a second example of the positive electrode potential of the battery and the reference electrode potential.

In the embodiment of FIGS. 7 and 8, the positive electrode potentials of the battery B estimated by the processor 130 are VA1 to VA5, and the reference electrode potentials are VRA1 to VRA5. Here, the reference electrode potentials VRA1 to VRA5 may be positive electrode potentials measured from a battery B in a BOL (Beginning of Life) state. In addition, even though the reference electrode potential VRC of the reference battery of Equation 2 and the calculated second electrode potential VBC of Equation 3 are estimated as the positive electrode potentials of the battery B, for the convenience of explanation, it should be noted that the estimated positive electrode potential of the battery B are described as VA1 to VA5 shown in FIGS. 7 and 8.

The processor 130 may calculate the potential difference through Equation 4 below.

$$VD = VA - VRA \quad \text{[Equation 4]}$$

Here, VD is the potential difference, VA the estimated positive electrode potential of the battery B, and VRA is the reference electrode potential corresponding to the positive electrode potential of the battery B.

For example, if the estimated electrode potential VA of the battery B is equal to the reference electrode potential VRA, the potential difference VD may be calculated as 0V. If the estimated positive electrode potential VA of the battery B is greater than the reference electrode potential VRA, the potential difference VD may be calculated within a range greater than 0V. If the estimated positive electrode potential VA of the battery B is smaller than the reference electrode potential VRA, the potential difference VD may be calculated within a range smaller than 0V.

For example, in the embodiment of FIGS. 7 and 8, the processor 130 may calculate the potential difference of the battery B based on the difference between the estimated electrode potentials VA1 to VA5 of the battery B and the reference electrode potentials VRA1 to VRA5. Specifically, the processor 130 may calculate a first potential difference based on the difference between a first positive electrode potential VA1 and a first reference electrode potential VRA1, and calculate a second potential difference based on the difference between a second positive electrode potential VA2 and a second reference electrode potential VRA2. In addition, the processor 130 may calculate a third potential difference based on the difference between a third positive electrode potential VA3 and a third reference electrode potential VRA3, and calculate a fourth potential difference based on the difference between a fourth positive electrode potential VA4 and a fourth reference electrode potential VRA4. Finally, the processor 130 may calculate a fifth potential difference through the difference between a fifth positive electrode potential VA5 and a fifth reference electrode potential VRA5.

The processor 130 may be configured to diagnose whether at least one of the active material area, the depth of charge and the depth of discharge of the battery is changed based on an increase or decrease pattern of the plurality of calculated potential differences. In this case, the processor 130 may select at least one diagnosis target electrode among the positive electrodes and the negative electrodes included in the battery, and diagnose whether at least one of the active material area, the depth of charge and the depth of discharge of the selected diagnosis target electrode is changed. For example, the processor 130 may select a positive electrode as the diagnosis target electrode and diagnose whether at least one of the active material area, the depth of charge and the depth of discharge of the positive electrode is changed. In addition, processor 130 may select a negative electrode as the diagnostic target electrode and diagnose whether at least one of the active material area, the depth of charge and depth of discharge of the negative electrode is changed. Also, the processor 130 may select both the positive electrode and the negative electrode as the diagnostic target electrode and diagnose whether at least one of the active material area, the depth of charge and the depth of discharge of the positive electrode and the negative electrode is changed, respectively.

Hereinafter, the process that the processor 130 determines the change of the active material area, the depth of charge and the depth of discharge of the electrode of the battery B will be described with reference to Tables 1 to 3 below.

TABLE 1

| | potential difference increase pattern | potential difference identical pattern | potential difference decrease pattern |
|---|---|---|---|
| first potential difference = 0 | | depth of discharge is identical | |
| first potential difference > 0 | | depth of discharge is decreased | |
| first potential difference < 0 | | depth of discharge is increased | |

Table 1 shows that the processor 130 diagnoses whether the depth of discharge of the electrode of the battery B is changed based on the increase or decrease pattern of the potential difference between the electrode potential of the battery B and the reference electrode potential. Hereinafter, for the sake of convenience of explanation, the case where the processor 130 diagnoses whether the depth of discharge of the positive electrode will be described. However, Table 1 may also be identically applied to the case where the processor 130 diagnoses the change of the depth of discharge of the negative electrode.

For example, referring to the former embodiment, the first potential difference in Table 1 means a potential difference between the first positive electrode potential VA1 corresponding to a smallest capacity among the plurality of positive electrode potentials of the battery B and the first reference electrode potential VRA1 corresponding to the first positive electrode potential VA1 among the plurality of reference electrode potentials.

In addition, in Table 1, the potential difference increase pattern means a pattern in which the potential difference between the plurality of positive electrode potentials and the corresponding reference electrode potential gradually increases, the potential difference identical pattern means a pattern in which the potential difference is constant, and the potential difference decrease pattern means a pattern in which the potential difference decreases gradually. For example, referring to the former embodiment, the potential difference increase pattern means a pattern in which the calculated potential differences gradually increase from the first potential difference to the sixth potential difference, the potential difference identical pattern means a pattern in which the calculated first potential difference to the calculated sixth potential difference are identical, and the potential difference decrease pattern means a pattern in which the calculated potential differences gradually decrease the first potential difference to the sixth potential difference.

If the first potential difference is 0 (zero), the processor 130 may diagnose that the depth of discharge of the positive electrode of the present battery B is equal to the depth of discharge of the positive electrode of the battery B in a BOL state. That is, if the first potential difference is 0, the processor 130 may diagnose that the depth of discharge of the positive electrode of the battery B is not changed from the depth of discharge of the positive electrode of the battery B in a BOL state.

Also, if the first potential difference is greater than 0, the processor 130 may diagnose that the depth of discharge of the battery B is decreased compared to the depth of discharge of the positive electrode of the battery B in a BOL state.

Also, if the first potential difference is smaller than 0, the processor 130 may diagnose that the depth of discharge of the battery B is increased compared to the depth of discharge of the positive electrode of the battery B in a BOL state.

TABLE 2

| | potential difference increase pattern | potential difference identical pattern | potential difference decrease pattern |
|---|---|---|---|
| first potential difference = 0 | active material area is decreased | active material area is identical | active material area is increased |
| first potential difference > 0 | | | |
| first potential difference < 0 | | | |

Table 2 shows that the processor 130 diagnoses whether the active material area of the electrode of the battery B is changed based on the increase or decrease pattern of the potential difference between the electrode potential of the battery B and the reference electrode potential. Hereinafter, the case where the processor 130 diagnoses whether the active material area of only the positive electrode is changed will be described for convenience of explanation. However, Table 2 may also be identically applied to the case where the processor 130 diagnoses whether the active material area of the negative electrode is changed.

Similar to the former embodiment, the first potential difference in Table 2 means a potential difference between the first positive electrode potential VA1 corresponding to a smallest capacity among the plurality of positive electrode potentials of the battery B and the first reference electrode potential VRA1 corresponding to the first positive electrode potential VA1 among the plurality of reference electrode potentials.

The processor 130 may diagnose the change of the active material area of the positive electrode of the battery B according to the potential difference increase or decrease pattern regardless of the first potential difference.

For example, if the potential difference increase or decrease pattern is the potential difference identical pattern, the processor 130 may diagnose that the active material area of the positive electrode of the present battery B is equal to the active material area of the positive electrode of the battery B in a BOL state. That is, if the potential difference increase or decrease pattern is the potential difference identical pattern, the processor 130 may diagnose that the active material area of the positive electrode of the battery B is not changed.

In addition, if the potential difference increase or decrease pattern is the potential difference increase pattern, the processor 130 may diagnose that the active material area of the positive electrode of the present battery B is decreased compared to the active material area of the positive electrode of the battery B in a BOL state.

In addition, if the potential difference increase or decrease pattern is the potential difference decrease pattern, the processor 130 may diagnose that the active material area of the positive electrode of the battery B is increased compared to the active material area of the positive electrode of the battery B in a BOL state.

TABLE 3

|  | potential difference increase pattern | potential difference identical pattern | potential difference decrease pattern |
|---|---|---|---|
| first potential difference = 0 | depth of charge is increased | depth of charge is identical | depth of charge is decreased |
| first potential difference > 0 | depth of charge is increased | depth of charge is increased | depth of charge depending on case |
| first potential difference < 0 | depth of charge depending on case | depth of charge is decreased | depth of charge is decreased |

Table 3 shows that the processor 130 diagnoses whether the depth of charge of the electrode of the battery B is changed based on the increase or decrease pattern of the potential difference between the electrode potential of the battery B and the reference electrode potential. Hereinafter, for convenience of explanation, the case where the processor 130 diagnoses whether the depth of charge of the positive electrode is changed will be described. However, Table 3 may also be identically applied to the case where the processor 130 diagnoses whether the depth of charge of the negative electrode is changed.

The processor 130 may diagnose whether the depth of charge of the positive electrode of the battery B is changed by using an $N^{th}$ potential difference. Here, N is the number of the plurality of inflection data, and the $N^{th}$ potential difference means a potential difference between an $N^{th}$ positive electrode potential corresponding to a greatest capacity, opposite to the first potential difference, and an $N^{th}$ reference electrode potential corresponding to the $N^{th}$ positive electrode potential. For example, in the embodiment of FIGS. 7 and 8, the $N^{th}$ positive electrode potential is the fifth positive electrode potential VA5, the $N^{th}$ reference electrode potential is the fifth reference electrode potential VRA5, and the $N^{th}$ potential difference is a potential difference between the fifth positive electrode potential VA5 and the fifth reference electrode potential VRA5.

If the $N^{th}$ potential difference is 0, the processor 130 may diagnose that the depth of charge of the positive electrode of the present battery B is identical to the depth of charge of the positive electrode of the battery B in a BOL state. Namely, if the $N^{th}$ potential difference is 0, the processor 130 may diagnose that the depth of charge of the positive electrode of the battery B is not changed.

Also, if the $N^{th}$ potential difference is greater than 0, the processor 130 may diagnose that the depth of charge of the positive electrode of the battery B is increased compared to the depth of charge of the positive electrode of the battery B in a BOL state.

Also, if the $N^{th}$ potential difference is smaller than 0, the processor 130 may diagnose that the depth of charge of the positive electrode of the battery B is decreased compared to the depth of charge of the positive electrode of the battery B in a BOL state.

The case where the first potential difference is 0 will be described first with reference to Table 3. If the first potential difference is 0 and the potential difference increase pattern is found, the $N^{th}$ potential difference is inevitably greater than 0. Thus, the processor 130 may diagnose that the depth of charge of the positive electrode of the battery B is increased compared to the depth of charge of the positive electrode of the battery B in a BOL state.

If the first potential difference is 0 and the potential difference identical pattern is found, since the $N^{th}$ potential difference is 0, the processor 130 may diagnose that the depth of charge of the positive electrode of the battery B is not changed from the depth of charge of the positive electrode of the battery B in a BOL state. That is, the processor 130 may diagnose that the depth of charge of the positive electrode of the battery B is equal to the depth of charge of the positive electrode of the battery B in a BOL state.

If the first potential difference is 0 and the potential difference decrease pattern is found, the $N^{th}$ potential difference is inevitably smaller than 0. Thus, the processor 130 may diagnose that the depth of charge of the positive electrode of the battery B is decreased compared to the depth of charge of the positive electrode of the battery B in a BOL state.

Next, the case where the first potential difference is greater than 0 will be described. If the first potential difference is greater than 0 and the potential difference increase pattern is found, the $N^{th}$ potential difference is inevitably greater than 0. Thus, the processor 130 may diagnose that the depth of charge of the positive electrode of the battery B is increased compared to the depth of charge of the positive electrode of the battery B in a BOL state.

If the first potential difference is greater than 0 and the potential difference identical pattern is found, the $N^{th}$ potential difference is inevitably greater than 0. Thus, the processor 130 may diagnose that the depth of charge of the positive electrode of the battery B is increased compared to the depth of charge of the positive electrode of the battery B in a BOL state.

If the first potential difference is greater than 0 and the potential difference decrease pattern is found, the processor 130 may diagnose the change of the depth of charge of the positive electrode of the battery B according to the size of the $N^{th}$ potential difference. That is, if the first potential difference is greater than 0 and the potential difference decrease pattern is found, the $N^{th}$ potential difference may be 0, greater than 0, or smaller than 0. Thus, if the first potential difference is greater than 0 and the potential difference decrease pattern is found, the processor 130 may calculate the $N^{th}$ potential difference and then diagnose the change of the depth of charge of the positive electrode of the battery B based on the calculated $N^{th}$ potential difference.

Finally, the case where the first potential difference is smaller than 0 will be explained. If the first potential difference is smaller than 0 and the potential difference increase pattern is found, the change of the depth of charge of the positive electrode of the battery B may be diagnosed, similar to case where the first potential difference is greater than 0 and the potential difference decrease pattern is found. That is, the processor 130 may calculate the $N^{th}$ potential difference and diagnose the change of the depth of charge of the positive electrode of the battery B based on the calculated $N^{th}$ potential difference.

If the first potential difference is smaller than 0 and the potential difference identical pattern is found, the $N^{th}$ potential difference is inevitably smaller than 0. Thus, the processor 130 may diagnose that the depth of charge of the positive electrode of the present battery B is decreased compared to the depth of charge of the positive electrode of the battery B in a BOL state.

If the first potential difference is smaller than 0 and the potential difference decrease pattern is found, the $N^{th}$ potential difference is inevitably smaller than 0. Thus, the processor 130 may diagnose that the depth of charge of the positive electrode of the present battery B is decreased compared to the depth of charge of the positive electrode of the battery B in a BOL state.

In the embodiment of FIG. 7, it is assumed that the first potential difference between the first positive electrode potential VA1 and the first reference electrode potential VRA1 is 0 and the potential difference increase or decrease pattern is the potential difference increase pattern. Referring to Tables 1 to 3 and the embodiment of FIG. 7, since the first electrode potential difference is 0, the processor 130 may diagnose that the depth of discharge of the positive electrode of the battery B is not changed from the depth of discharge of the positive electrode of the battery B in a BOL state. In addition, since the potential difference increase or decrease pattern is the potential difference increase pattern, the processor 130 may diagnose that the active material area of the positive electrode of the battery B is decreased compared to the active material area of the positive electrode of the battery B in a BOL state. In addition, since the potential difference between the fifth positive electrode potential VA5 and the fifth reference electrode potential VRA5 corresponding to the $N^{th}$ potential difference is greater than 0, the processor 130 may diagnose that the depth of charge of the positive electrode of the battery B is increased compared to the depth of charge of the positive electrode of the battery B in a BOL state.

In the embodiment of FIG. 8, it is assumed that the first potential difference between the first positive electrode potential VA1 and the first reference electrode potential VRA1 is 0, and the potential difference increase or decrease pattern is the potential difference decrease pattern. Referring to Tables 1 to 3 and the embodiment of FIG. 8, since the first potential difference is 0, the processor 130 may diagnose that the depth of discharge of the positive electrode of the battery B is not changed from the depth of discharge of the positive electrode of the battery B in a BOL state. In addition, since the potential difference increase or decrease pattern is the potential difference decrease pattern, the processor 130 may diagnose that the active material area of the positive electrode of the battery B is increased compared to the active material area of the positive electrode of the battery B in a BOL state. In addition, since the potential difference between the fifth positive electrode potential VA5 and the fifth reference electrode potential VRA5 corresponding to the $N^{th}$ potential difference is smaller than 0, the processor 130 may diagnose that the depth of charge of the positive electrode of the battery B is decreased compared to the depth of charge of the positive electrode of the battery B in a BOL state.

After it is diagnosed that at least one of the active material area, the depth of charge and the depth of discharge of the electrode of the battery B is changed, the processor 130 may determine the mode of the battery B as a normal mode or a failure mode based on the diagnosis result. In addition, after determining the mode of the battery B, the processor 130 may set the mode of the battery B to the determined mode.

Specifically, the processor 130 may be configured to determine the mode of the battery B as a failure mode if it is diagnosed that any one of the active material area, the depth of charge and the depth of discharge of the battery B is changed. In addition, the processor 130 may set the mode of the battery B to a failure mode.

For example, referring to Tables 1 to 3, the processor 130 may independently determine the change of the active material area, the depth of charge and the depth of discharge of the electrode of the battery B, respectively. In particular, the processor 130 may diagnose that all of the active material area, the depth of charge and the depth of discharge of the electrode of the battery B are not changed only when the first potential difference is 0 and the potential difference identical pattern is found. Thus, the processor 130 may determine that the mode of the battery B is a normal mode only when the first potential difference is 0 and the potential difference identical pattern is found. In addition, the processor 130 may set the mode of the battery B to a normal mode.

Referring to the former embodiment, in the embodiment of FIG. 7, the processor 130 diagnoses that the depth of discharge of the positive electrode of the battery B is not changed, but the active material area of the positive electrode is decreased and the depth of charge of the positive electrode is increased. Thus, the processor 130 may determine the mode of the battery B as a failure mode.

Also, referring to the former embodiment, in the embodiment of FIG. 8, the processor 130 diagnoses that the depth of discharge of the positive electrode of the battery B is not changed, but the active material area of the positive electrode is increased and the depth of charge of the positive electrode is decreased. Thus, the processor 130 may determine the mode of the battery B as a failure mode.

Namely, the apparatus 100 for diagnosing a battery according to an embodiment of the present disclosure may accurately diagnose the cause of battery degeneration and determine the mode of the battery B as a normal mode or a failure mode depending on the cause of degeneration. In addition, if it is determined that any one of the active material area, the depth of discharge and the depth of charge of the electrode of the battery B is increased or decreased compared to the BOL state, the apparatus 100 for diagnosing a battery may determine that the mode of the battery B as a failure mode and prevent an unexpected problem such as over discharge or overcharge that might occur due to battery degeneration.

Hereinafter, the diagnosis of the change of the active material area, the depth of discharge and the depth of charge change of the positive electrode of the battery B and the determination of the mode of the battery B will be described with reference to FIGS. 9 and 10.

Figure 9:
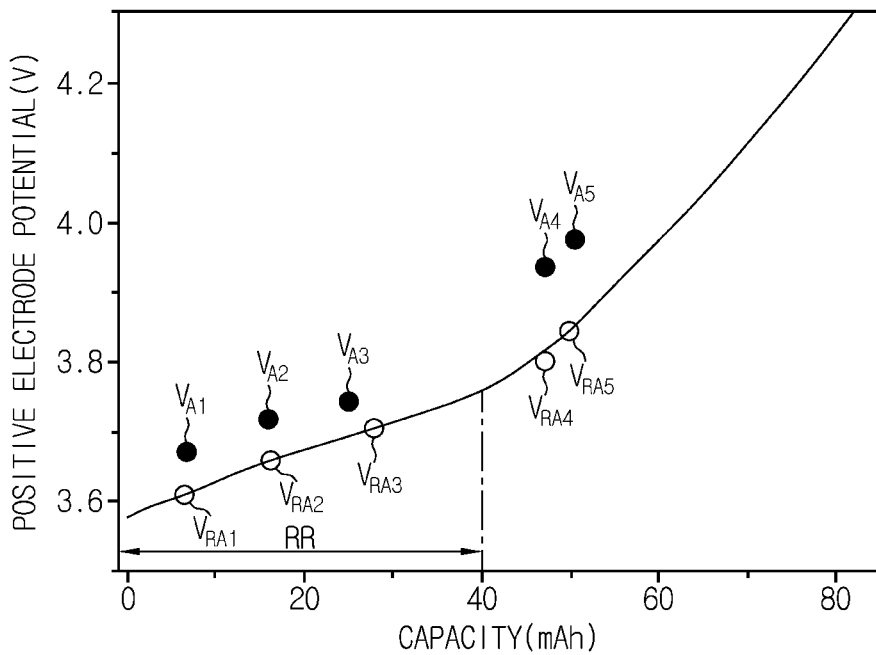
FIG. 9 is a diagram showing a third example of the positive electrode potential of the battery and the reference electrode potential.

FIG. 9 is a diagram showing a third example of the positive electrode potential of the battery and the reference electrode potential. FIG. 10 is a diagram showing a fourth example of the positive electrode potential of the battery and the reference electrode potential.

First, the processor 130 may be configured to calculate a change rate between the reference electrode potentials, adjust the size of a preset reference capacity region based on the calculated change rate, and calculate a potential difference by selecting only the electrode potential belonging to the size-adjusted reference capacity region among the estimated electrode potentials.

The size of the preset reference capacity region may be equal to the capacity of the battery B. For example, in the embodiment of FIGS. 9 and 10, the size of the preset reference capacity region may be preset as 0 mAh to 80 mAh.

Figure 10:
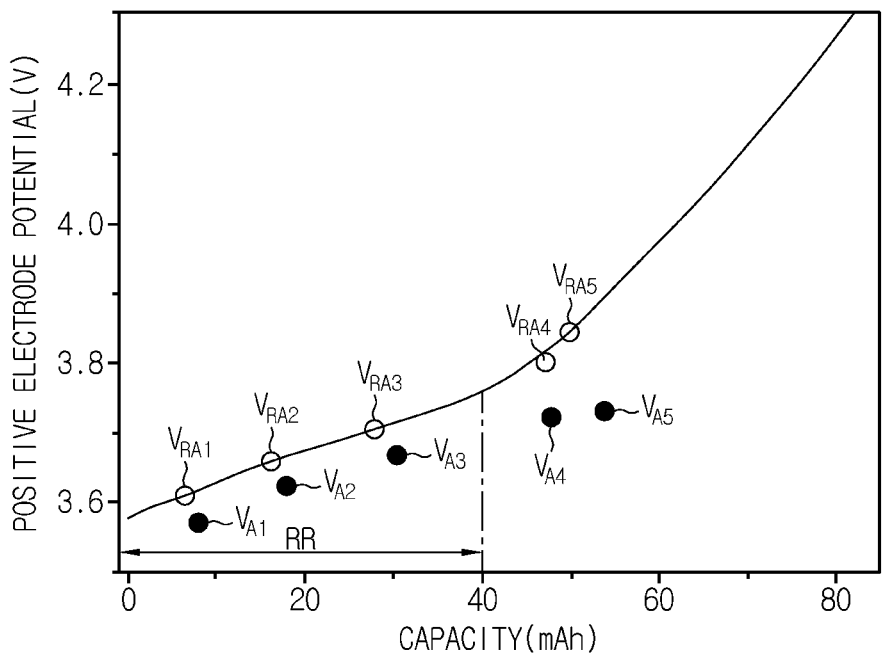
FIG. 10 is a diagram showing a fourth example of the positive electrode potential of the battery and the reference electrode potential.

In the embodiment of FIGS. 9 and 10, the rate of change between the reference electrode potentials means a change rate of a slope of a curve including the first reference electrode potential VRA1, the second reference electrode potential VRA2, the third reference electrode potential VRA3, the fourth reference electrode potential VRA4, and the fifth reference electrode potential VRA5. That is, since the slope of the curve is rapidly increasing based on the capacity 40 mAh, the processor 130 may adjust the size of the preset reference capacity region from "0 mAh to 80 mAh" to "0 mAh to 40 mAh". The size-adjusted reference capacity region is a RR region in the embodiment of in FIGS. 9 and 10.

The processor 130 may diagnose the change of at least one of the active material area and the depth of discharge of the positive electrode of the battery B, based on the first positive electrode potential VA1, the second positive electrode potential VA2 and the third positive electrode potential VA3 belonging to the RR region. However, the processor 130 may diagnose the change of the depth of charge of the positive electrode of the battery B based on the potential difference between the fifth positive electrode potential VA5 corresponding to the $N^{th}$ positive electrode potential and the fifth reference electrode potential.

For example, in the embodiment of FIG. 9, it is assumed that the potential difference increase or decrease pattern in the RR region is the potential difference identical pattern. Since the first potential difference between the first positive electrode potential VA1 and the first reference electrode potential VRA1 is greater than 0 and the potential difference increase or decrease pattern is the potential difference identical pattern, the processor 130 may diagnose that the active material area of the positive electrode of the battery B is not changed from the active material area of the positive electrode of the battery B in a BOL state. Also, the processor 130 may diagnose that the depth of discharge of the positive electrode of the battery B is decreased compared to the depth of discharge of the positive electrode of the battery B in a BOL state. In addition, since the potential difference between the fifth positive electrode potential VA5 and the fifth reference electrode potential VRA5 is greater than 0, the processor 130 may diagnose that the depth of charge of the positive electrode of the battery B is increased compared to the depth of charge of the positive electrode of the battery B in a BOL state. Thus, in the case of FIG. 9, the processor 130 may determine the mode of the battery B as a failure mode.

As another example, in the embodiment of FIG. 10, it is assumed that the potential difference increase or decrease pattern in the RR region is the potential difference identical pattern. Since the first potential difference between the first positive electrode potential VA1 and the first reference electrode potential VRA1 is smaller than 0 and the potential difference increase or decrease pattern is the potential difference identical pattern, the processor 130 may diagnose that the active material area of the positive electrode of the battery B is not changed from the active material area of the positive electrode of the battery B in a BOL state. Also, the processor 130 may diagnose that the depth of discharge of the positive electrode of the battery B is increased compared to the depth of discharge of the positive electrode of battery B in a BOL state. In addition, since the potential difference between the fifth positive electrode potential VA5 and the fifth reference electrode potential VRA5 is smaller than 0, the processor 130 may diagnose that the depth of charge of the positive electrode of the battery B is decreased compared to the depth of charge of the positive electrode of the battery B in a BOL state. Thus, in the case of FIG. 10, the processor 130 may determine the mode of the battery B as a failure mode.

The processor 130 may transmit a message indicating the estimated electrode potential of the battery B to an external device through a communication terminal (COM).

In addition, the processor 130 may transmit a message indicating the diagnosis result of the active material area, the depth of charge and the depth of discharge of the battery B to the external device through the communication terminal (COM).

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

Meanwhile, a vehicle according to the present disclosure may include the apparatus for diagnosing a battery described above. By doing so, the electrode potential of a battery pack included in the vehicle may be estimated.

Meanwhile, an energy storage system according to the present disclosure may include the apparatus for diagnosing a battery described above. By doing so, the electrode potential of a battery pack included in the energy storage system may be estimated.

Figure 11:
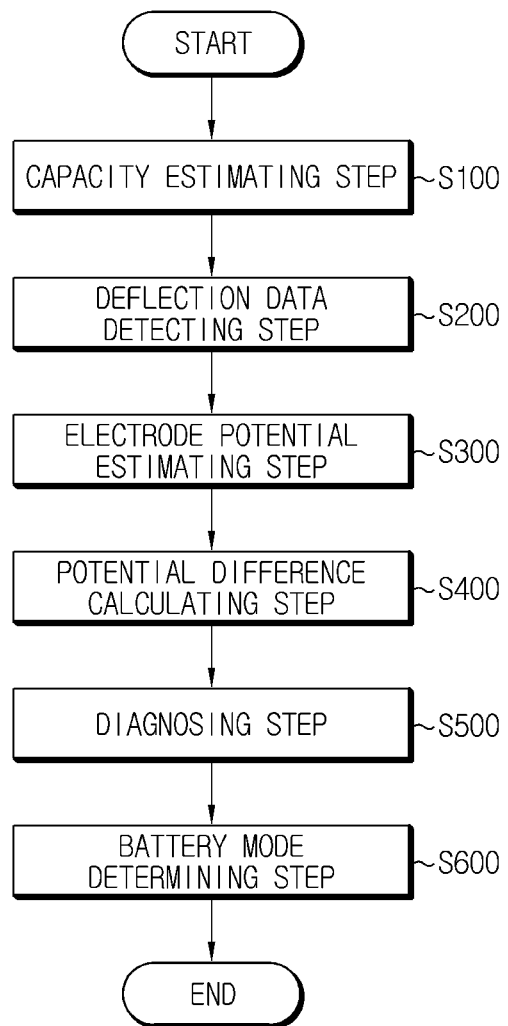
FIG. 11 is a flowchart for schematically illustrating a method for diagnosing a battery according to another embodiment of the present disclosure.

FIG. 11 is a flowchart for schematically illustrating a method for diagnosing a battery according to another embodiment of the present disclosure. Here, the method for diagnosing a battery may be performed in the apparatus 100 for diagnosing a battery according to an embodiment of the present disclosure.

Referring to FIG. 11, the method for diagnosing a battery may include a capacity estimating step (S100), an inflection data detecting step (S200), an electrode potential estimating step (S300), a potential difference calculating step (S400), a diagnosing step (S500) and a battery mode determining step (S600).

The capacity estimating step (S100) is a step of measuring a potential and a current of the battery B and estimating a capacity of the battery B based on the measured current. In the capacity estimating step (S100), the potential and the current of the battery B may be measured by the sensing unit 110, and the capacity of the battery B may be estimated by the processor 130.

The processor 130 may estimate the capacity of the battery B based on the current of the battery B measured by the sensing unit 110. Here, the capacity of the battery B may be a state of charge (SOC) of the battery B.

The inflection data detecting step (S200) is a step of detecting a plurality of inflection data included in potential-capacity data based on the potential-capacity data in which the measured potential and the estimated capacity are mapped with each other. The inflection data detecting step (S200) may be performed by the processor 130.

The processor 130 may generate the potential-capacity data by mapping the capacity estimated for the battery B and the potential of the battery B measured by the sensing unit 110 with each other, and store the generated potential-capacity data in the memory unit 120.

In addition, the processor 130 may detect the plurality of inflection data from the potential-capacity data. Here, the inflection data may include potential and capacity data at an inflection point of a potential-capacity curve that expresses the potential-capacity data on a two-dimensional plane.

The electrode potential estimating step (S300) is a step of estimating the electrode potential of the plurality of inflection data based on the potential, capacity and number of the plurality of detected inflection data. The electrode potential estimating step (S300) may be performed by the processor 130.

The processor 130 may classify the plurality of detected inflection data into a first group and a second group based on a preset reference potential. In addition, the processor 130 may identify a negative electrode active material type and a positive electrode active material type of the battery B, based on the number of inflection data belonging to the first group and the number of inflection data belonging to the second group.

For example, the memory unit 120 may store active material type data where the active material type of the electrode is mapped with the number of the inflection data belonging to the first group and the number of the inflection data in the second group, in advance. Thus, the processor 130 may identify the negative electrode active material type and the positive electrode active material type of the battery B based on the active material type data previously stored in the memory unit 120.

The processor may identify the negative electrode active material type and the positive electrode active material type of the battery B and then estimate the positive electrode potential and the negative electrode potential of the battery B by using the first electrode-capacity data and the second electrode-capacity data stored in the memory unit 120. Here, the stored first electrode-capacity data is a previously stored data where the reference positive electrode potential and the reference capacity are matched according to the positive electrode active material type, and the stored second electrode-capacity data is a previously stored data where the reference negative electrode potential and the reference capacity are matched according to the negative electrode active material type.

The processor 130 may extract the reference positive electrode potential matched with the reference capacity corresponding to the capacity of the inflection data belonging to the first group from the stored first electrode-capacity data, and estimate the extracted reference positive electrode potential as the positive electrode potential at each capacity of the inflection data belonging to the first group. In addition, the processor 130 may calculate the negative electrode potential by computing the difference between the potential of the inflection data belonging to the first group and the extracted reference positive electrode potential, and estimate the calculated negative electrode potential as the negative electrode potential at each capacity of the inflection data belonging to the first group.

In addition, the processor 130 may extract the reference negative electrode potential matched with the reference capacity corresponding to the capacity of the inflection data belonging to the second group from the stored second electrode-capacity data, and estimate the extracted reference negative electrode potential as the negative electrode potential at each capacity of the inflection data belonging to the second group. In addition, the processor 130 may calculate the positive electrode potential by computing the sum of the potential of the inflection data belonging to the second group and the extracted reference negative electrode potential, and estimate the calculated positive electrode potential as the positive electrode potential at each capacity of the inflection data belonging to the second group.

The potential difference calculating step (S400) is a step of calculating a potential difference between the plurality of estimated electrode potentials and the reference electrode potential. The potential difference calculating step (S400) may be performed by the processor.

The processor 130 may calculate the potential difference between the electrode potential estimated for the battery B and the reference electrode potential.

For example, in the embodiment of FIG. 7, the processor 130 may calculate the potential difference between the estimated positive electrode potentials VA1 to VA5 and the reference electrode potentials VRA1 to VRA5.

Specifically, the processor 130 may calculate the first potential difference based on the difference between the first positive electrode potential VA1 and the first reference electrode potential VRA1, and calculate the second potential difference based on the difference between the second positive electrode potential VA2 and the second reference electrode potential VRA2. In addition, the processor 130 may calculate the third potential difference based on the difference between the third positive electrode potential VA3 and the third reference electrode potential VRA3, and calculate the fourth potential difference based on the difference between the fourth positive electrode potential VA4 and the fourth reference electrode potential VRA4. Finally, the processor 130 may calculate the fifth potential difference based on the difference between the fifth positive electrode potential VA5 and the fifth reference electrode potential VRA5.

The diagnosing step (S500) is a step of diagnosing whether at least one of the active material area, the depth of charge and the depth of discharge of the electrode of the battery B is changed, based on the increase or decrease pattern of the plurality of calculated potential differences. The diagnosing step (S500) may be performed by the processor 130.

The processor 130 may select at least one diagnosis target electrode among the positive electrodes and the negative electrodes of the battery B. In addition, the processor 130 may diagnose whether at least one of the active material area, the depth of charge and the depth of discharge of the selected electrode is changed, based on the first potential difference, the potential difference increase or decrease pattern, and the $N^{th}$ potential difference.

For example, in the embodiment of FIG. 7, it is assumed that the first potential difference between the first positive electrode potential VA1 and the first reference electrode potential VRA1 is 0 and the potential difference increase or decrease pattern is the potential difference increase pattern. Since the first electrode potential difference is 0, the processor 130 may diagnose that the depth of discharge of the battery B is not changed. In addition, since the potential difference increase or decrease pattern is the potential difference increase pattern, the processor 130 may diagnose that the active material area of the battery B is decreased. In addition, since the fifth potential difference between the fifth positive electrode potential VA5 and the fifth reference electrode potential VRA5 is greater than 0, the processor 130 may diagnose that the depth of charge of the battery B is increased.

The battery mode determining step (S600) is a step of determining the mode of the battery as a normal mode or a failure mode, based on the diagnosis result of the diagnosing step (S500). The battery mode determining step (S600) may be performed by the processor 130.

If it is diagnosed that at least one of the depth of discharge, the active material area and the depth of charge of the electrode of the battery B is changed, the processor 130 may determine that the mode of the battery B is a failure mode. Specifically, the processor 130 may determine that the mode of the battery B is a failure mode if it is diagnosed that at least one of the depth of discharge, the active material area and the depth of charge of the battery B is increased or decreased compared to the BOL state. That is, if the diagnosis result of the depth of discharge, the active material area and the depth of charge of the battery B corresponds to at least one of a case where the depth of discharge of the battery B is increased or decreased compared to the depth of discharge of the battery B in the BOL state, a case where the active material area of the battery B is increased or decreased compared to the active material area of the battery B in the BOL state and a case where the depth of charge of the battery B is increased or decreased compared to the depth of charge of the battery B in the BOL state, the processor 130 may determine that the mode of the battery B is a failure mode.

For example, as battery B degrades, various problems such as lithium plating and swelling phenomenon as well as overdischarge and overcharge may occur. Thus, if it is diagnosed that any one of the depth of discharge, the active material area change and the depth of charge of the electrode of the battery B is increased or decreased compared with that in the BOL state, the processor 130 determines that the mode of the battery B is a failure mode, thereby preventing unexpected problems that might occur at the battery B in advance.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
B: battery
100: apparatus for diagnosing a battery
110: sensing unit
120: memory unit
130: processor

What is claimed is:

1. An apparatus for diagnosing a battery, comprising:
one or more sensors configured to measure a potential and a current of a battery; and
a processor configured to:
estimate a capacity of the battery based on the current measured by the one or more sensors;
generate potential-capacity data indicating a mapping of the potential measured by the one or more sensors and the estimated capacity with each other;
detect a plurality of inflection points included in the potential-capacity data;
for each detected inflection point, estimate an electrode potential at the detected inflection point;
for each estimated electrode potential, calculate a potential difference between the estimated electrode potential and a reference electrode potential;
determine whether at least one of an active material area, a depth of charge or a depth of discharge of an electrode of the battery is changed based on an increase or decrease pattern of the plurality of calculated potential differences; and
determine a mode of the battery based on whether at least one of the active material area, the depth of charge or the depth of discharge is changed, wherein the mode of the battery is one of a normal mode or a failure mode.

2. The apparatus for diagnosing a battery according to claim 1,
wherein the processor is configured to:
determine a total number of inflection points included in the potential-capacity data; and
determine a negative electrode active material type and a positive electrode active material type of the battery based on the total number of inflection points included in the potential-capacity data, and further based on previously stored active material type data in which the total number of inflection points, the negative electrode active material type and the positive electrode active material type are mapped with one another.

3. The apparatus for diagnosing a battery according to claim 1,
wherein the processor is configured to determine that the mode of the battery is the failure mode when it is determined that at least one of the active material area, the depth of charge or the depth of discharge is changed.

4. The apparatus for diagnosing a battery according to claim 1,
wherein the processor is configured to:
classify the plurality of inflection points into a first group and a second group according to a respective magnitude of potential at each of the inflection points,
for each inflection point included in the first group:
extract a reference positive electrode potential matched with a reference capacity corresponding to the capacity at the inflection point from stored first electrode-capacity data; and
estimate the extracted reference positive electrode potential as a positive electrode potential at the capacity of at the inflection point, and
for each inflection point included in the second group:
extract a reference negative electrode potential matched with a reference capacity corresponding to the capacity at the inflection point from stored second electrode-capacity data; and
estimate a positive electrode potential at the capacity at the inflection point based on the extracted reference negative electrode potential and the potential at the inflection point.

5. The apparatus for diagnosing a battery according to claim 4,
wherein the stored first electrode-capacity data is previously stored data in which the reference positive electrode potential and the reference capacity are matched according to a positive electrode active material type, and
wherein the stored second electrode-capacity data is previously stored data in which the reference negative electrode potential and the reference capacity are matched according to a negative electrode active material type.

6. The apparatus for diagnosing a battery according to claim 1,
wherein each estimated electrode potential corresponds to a different reference electrode potential, and
wherein the processor is configured to, for each estimated electrode potential, calculate a potential difference between the corresponding reference electrode potential and the estimated electrode potential.

7. The apparatus for diagnosing a battery according to claim 6,
wherein, when all of the potential differences calculated for all of the plurality of estimated electrode potentials are 0V, the processor is configured to:
determine that none of the active material area, the depth of discharge or the depth of charge are changed; and
determine that the mode of the battery is the normal mode.

8. The apparatus for diagnosing a battery according to claim 6,
wherein, when the potential difference calculated for an electrode potential corresponding to a smallest capacity among the plurality of estimated electrode potentials is 0V, the processor is configured to determine that the depth of discharge is not changed,
wherein, when the potential difference calculated for the electrode potential corresponding to the smallest capacity is greater than 0V, the processor is configured to determine that the depth of discharge is decreased, and
wherein, when the potential difference calculated for the electrode potential corresponding to the smallest capacity is smaller than 0V, the processor is configured to determine that the depth of discharge is increased.

9. The apparatus for diagnosing a battery according to claim 6,
wherein when the potential differences calculated for the plurality of estimated electrode potentials are identical, the processor is configured to determine that the active material area is not changed,
wherein when the potential differences calculated for the plurality of estimated electrode potentials increase as a corresponding capacity increases, the processor is configured to determine that the active material area is decreased, and
wherein when the potential differences calculated for the plurality of estimated electrode potentials decrease as a corresponding capacity increases, the processor is configured to determine that the active material area is increased.

10. The apparatus for diagnosing a battery according to claim 6,
wherein when the potential difference calculated for an electrode potential corresponding to a greatest capacity among the plurality of estimated electrode potentials is 0V, the processor is configured to determine that the depth of charge is not changed,
wherein when the potential difference calculated for the electrode potential corresponding to the greatest capacity is greater than 0V, the processor is configured to determine that the depth of charge is increased, and
wherein when the potential difference calculated for the electrode potential corresponding to the greatest capacity is smaller than 0V, the processor is configured to determine that the depth of charge is decreased.

11. The apparatus for diagnosing a battery according to claim 6,
wherein the processor is configured to:
calculate a rate of change between the reference electrode potentials;
adjust a size of a preset reference capacity region based on the calculated change rate; and
calculate the potential difference by selecting only an electrode potential belonging to the size-adjusted reference capacity region among the estimated electrode potentials.

12. The apparatus for diagnosing a battery according to claim 1,
wherein the processor is configured to:
select at least one diagnosis target electrode among positive electrodes or negative electrodes included in the battery;
determine whether at least one of the active material area, the depth of charge or the depth of discharge of the selected diagnosis target electrode is changed; and determine the mode of the battery based on whether at least one of the active material area, the depth of charge or the depth of discharge of the selected diagnosis target electrode is changed.

13. A battery management system, comprising the apparatus for diagnosing a battery according to claim 1.

14. A vehicle, comprising the apparatus for diagnosing a battery according to claim 1.

15. A method for diagnosing a battery, comprising:

measuring a potential and a current of a battery;

estimating a capacity of the battery based on the measured current;

generating potential-capacity data indicating a mapping of the measured potential and the estimated capacity with each other;

detecting a plurality of inflection points included in the potential-capacity data;

for each detected inflection point, estimating an electrode potential at the detected inflection point;

for each estimated electrode potential, calculating a potential difference between the estimated electrode potential and a reference electrode potential;

determining whether at least one of an active material area, a depth of charge or a depth of discharge of an electrode of the battery is changed based on an increase or decrease pattern of the plurality of calculated potential differences; and determining a mode of the battery based on whether at least one of the active material area, the depth of charge or the depth of discharge is changed, wherein the mode of the battery is one of a normal mode or a failure mode.

* * * * *